US005737171A

United States Patent [19]
Buller et al.

[11] Patent Number: 5,737,171
[45] Date of Patent: Apr. 7, 1998

[54] SWITCHED MANAGEMENT OF THERMAL IMPEDENCE TO REDUCE TEMPERATURE EXCURSIONS

[75] Inventors: Marvin Lawrence Buller, Austin; Gary Dale Carpenter, Pflugerville; Binh Thai Hoang, Round Rock, all of Tex.

[73] Assignee: International Business Machines Corporation, Armonk, N.Y.

[21] Appl. No.: 680,451

[22] Filed: Jul. 15, 1996

[51] Int. Cl.$^6$ ...................................... H02H 5/04
[52] U.S. Cl. ............................. 361/103; 361/115
[58] Field of Search .................. 361/103, 104, 361/105, 106, 115, 110; 364/707; 307/117

[56] References Cited

U.S. PATENT DOCUMENTS

| | | | |
|---|---|---|---|
| 5,409,352 | 4/1995 | Lin | 415/177 |
| 5,437,327 | 8/1995 | Chiou | 165/122 |
| 5,457,342 | 10/1995 | Herbst, II | 257/712 |
| 5,466,969 | 11/1995 | Tsunoda | 257/706 |
| 5,475,564 | 12/1995 | Chiou | 361/704 |
| 5,483,102 | 1/1996 | Neal et al. | 257/712 |
| 5,491,610 | 2/1996 | Mok et al. | 361/695 |
| 5,513,361 | 4/1996 | Young | 395/750 |

OTHER PUBLICATIONS

IBM Technical Disclosure Bulletin, vol. 20, No. 12, May 1978, "Powered Thermal Switch", p. 5096.
IBM Technical Disclosure Bulletin, vol. 38, No. 08, Aug. 1995, "Variable–Speed Cooling Assembly for a Processor Chip", pp. 613–614.
IBM Technical Disclosure Bulletin, vol. 26, No. 4, Sep. 1983, "Temperature–Sensitive Speed Control Circuit for DC Fan Motors", pp. 1832–1833.

*Primary Examiner*—Jeffrey A. Gaffin
*Assistant Examiner*—Stephen Jackson
*Attorney, Agent, or Firm*—Casimer K. Salys

[57] ABSTRACT

Systems and methods for reducing the thermal stresses between an integrated circuit package and a printed circuit board, each having different thermal coefficients of expansion, to minimize thermal fatigue induced by power management cycling. The thermal impedance of the convection cooling system used with the integrated circuit package is switched with the state of the power management signal. A fan on the integrated circuit package heat sink is energized when the integrated circuit is operated in a high power mode and disabled when the integrated circuit is in a low power mode initiated by the power management system. The switching is directly responsive to the power management system and without regard to integrated circuit package temperature. The switching of the fan alters the thermal impedance to reduce the extremes of the temperature excursion and to materially reduce the rate of change of temperature experienced by the integrated circuit package. Relative temperature induced stresses on the connection between the printed circuit board and integrated circuit package are decreased.

8 Claims, 3 Drawing Sheets

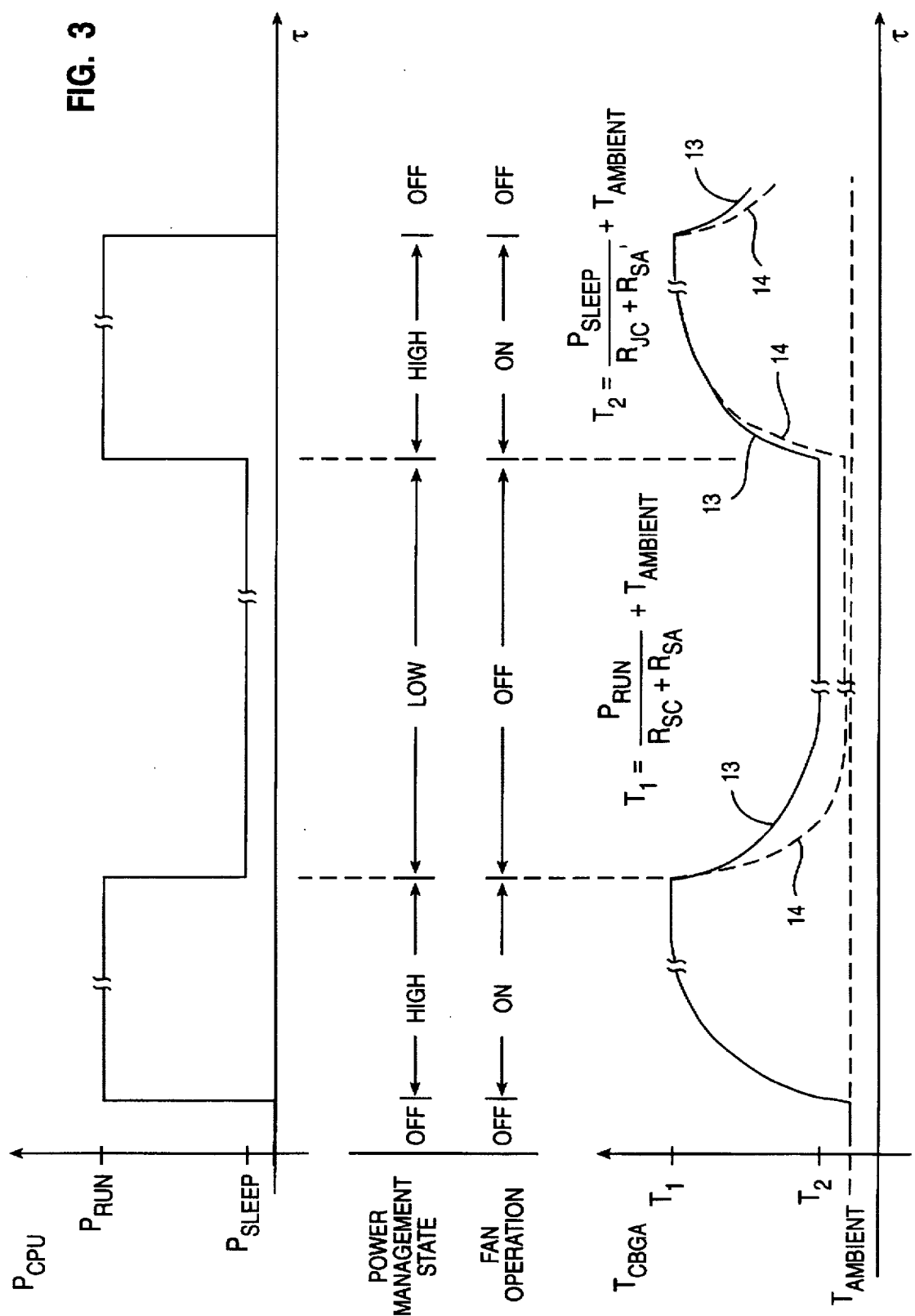

SWITCHED MANAGEMENT OF THERMAL IMPEDENCE TO REDUCE TEMPERATURE EXCURSIONS

FIELD OF THE INVENTION

The present invention relates generally to thermal management. More particularly, the invention is directed to apparatus and methods for reducing stresses associated with mismatches in thermal coefficient of expansion by reducing thermal transients associated with operational power variations.

BACKGROUND OF THE INVENTION

Personal computers, workstations and even the majority of computer servers employ air cooling to regulate the temperatures within the enclosures holding the electronic devices. With the growing prevalence of such computing systems not only in the office but also in the home, there has been an associated pursuit of designs which reduce power consumption and associated heating of the work areas within which they are located. One solution to the power dissipation concern has been to incorporate power management capabilities into the various electronic devices. Power management has proven to be particularly desirable for microprocessor designs, where the high levels of performance have resulted in tremendous circuit integration, high clock rates, and associated high power dissipation in packaged integrated circuit chips. Though other integrated circuit devices can gain from power management, microprocessors are particularly appropriate candidates in that they often transition from operating modes involving extensive computation and associated power dissipation to extended periods of substantially idle and low power operation.

Power management techniques often have microprocessors and related integrated circuit devices transition to different levels depending on the extent of operational activity. In cycling through such low power modes, the packaged integrated circuit chip temperatures vary in relation to the operational levels of the integrated circuits.

With decreases in integrated circuit device dimensions and increases in chip functionality, the pinout arrangements of integrated circuit packages have transitioned from wires situated peripherally along the integrated circuit package boundaries to pin or ball grid array configurations, the latter representing the industry trend for new designs. Ball grid array packaged integrated circuits, whether they be associated with a ceramic package or a flip-chip device, utilize direct solder bonding between an array of high melting temperature solder balls on the integrated circuit package and a corresponding array of copper pads on fire retardant type 4 (FR4) or analogous fiberglass printed circuit boards. The coefficients of thermal expansion of the silicon chips and ceramic packages are materially different than those of conventional fiberglass printed circuit boards. For example, a ceramic substrate has a nominal thermal coefficient of expansion of 7 ppm/C while FR4 printed circuit board is 20 ppm/C in the plane of the card and 60–80 ppm/C across the plane of the card.

Given the large sizes and levels of power being dissipated by microprocessor it has become common to attach not only heat sinks but heat sinks with miniature fans directly to the packaged integrated circuit. The fans focus the air flow directly onto the integrated circuit package and related heat sink structure to convectively cool, and limit the temperature of, the integrated circuit. Furthermore, it is quite common to have a separate fan move cooling air through the computer system enclosure holding the printed circuit board on which the microprocessor is mounted, as well as other boards and components.

The thermal stresses between the integrated circuit package and printed circuit board to which it is mounted, and particularly where the connection is through a ball grid array, eventually cause fatigue failures in the solder connections. Life testing of such systems has shown that ball grid array connections between packaged integrated circuits and FR4 printed circuit boards are somewhat vulnerable to thermal cycling. For conventional on/off operation of computers and the associated microprocessors the limitations were considered to be acceptable in view of the overall computer design. However, with the advent of the additional and more frequent thermal cycling associated with power management the fatigue failure rates can no longer be overlooked. The introduction of power management not only increases by a significant number the thermal stress cycles, but does so in a relatively unpredictable manner. Namely, the repetition rate of the thermal cycling is directly influenced by the program being executed and the users interaction with the computer system. Thus, there is a need for improving the thermal stress related reliability of the ball grid interface for power managed integrated circuits.

Variations of one solution to the problem are described in U.S. Pat. No. 5,491,610 and IBM Technical Disclosure Bulletin, Vol. 38, No. 8, PP. 613–614, August 1995, wherein temperature sensors are attached to the heat sink and used to regulate the speed of the fan in maintaining a relatively constant temperature. Unfortunately, such implementations require the complexity of temperature sensors, fan motor controllers, and fan motors capable of varying speeds. Though such refinements may improve the reliability of the connection between the integrated circuit package and FR4 board, they introduce the added complexity and reduced reliability associated with temperature sensing and fan speed regulation.

Therefore, there remains a need for a system and method by which thermal stresses between a printed circuit board and integrated circuit package of ball grid array design can be reduced with minimum design changes and complexity.

SUMMARY OF THE INVENTION

The problems of constraining integrated circuit package temperature excursions in a computer system utilizing convection cooling are solved using an apparatus comprising means for enabling or disabling the convective cooling of a selected packaged integrated circuit, means for indicating high and low operating power states in the packaged integrated circuit, and means for respectively enabling the means for convective cooling responsive to an indication of a high power state and disabling the means for convective cooling responsive to an indication of a low power state, without regard to the packaged integrated circuit temperature.

In another form, the invention contemplates a method of limiting temperature excursions in a computer system utilizing convection cooling to constrain integrated circuit package temperatures, comprising the steps of positioning a source of convective coolant proximate a selected packaged integrated circuit, sensing high and low operating power states in the packaged integrated circuit, enabling the flow of convective coolant onto the packaged integrated circuit responsive to the sensing of a high operating power state, and disabling the flow of convective coolant onto the packaged integrated circuit responsive to the sensing of a low operating power state.

In a particularized form of the invention, the thermal impedance between the integrated circuit package and ambient air is changed in response to the state of the power management system. This is accomplished by selectively enabling and disabling the fan used to cool the integrated circuit package, whereby the fan is enabled when the power management signal indicates a high power state and the fan is disabled when the power management indicates a low power state. The integrated circuit package fan is switched responsive solely to the power management signal without attempting to ascertain or control the actual temperature of the integrated circuit package. The system and method of the invention reduce not only the extremes of the temperature excursion associated with changes in the power management state, but also materially reduce the rate of change of the temperature on the integrated circuit package. Reducing the rates and extremes of the temperature decreases the thermal stress associated with power managed cycles on ball grid array connections and improves the reliability of the interface between integrated circuit package and FR4 printed circuit board.

BRIEF DESCRIPTION OF THE DRAWINGS

FIG. 3 is a schematic relating plots of power and temperature to illustrate the effects of the present invention.

DESCRIPTION OF THE PREFERRED EMBODIMENT

Figure 1:
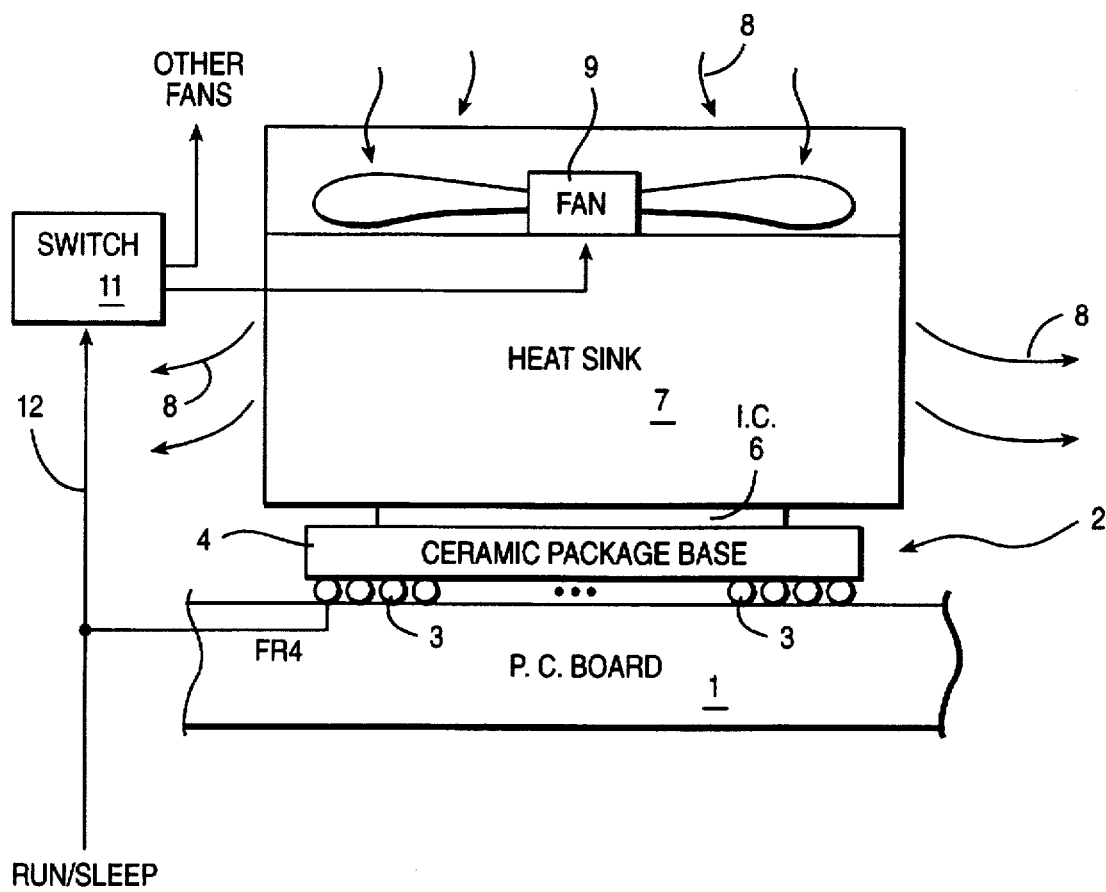
FIG. 1 is a schematic diagram illustrating the invention in the context of reducing thermal stresses between an integrated circuit package and printed circuit board through the switch control of the integrated circuit package fan.

FIG. 1 schematically illustrates one embodiment of the invention. Printed circuit board 1 has attached thereto a ball grid array packaged integrated circuit, generally at 2, with of an array of solder balls 3 electrically connected through ceramic package base 4 to integrated circuit chip 6. Generally, that combination will be referred to as a packaged integrated circuit. Mounted atop the packaged integrated circuit, and in intimate contact with integrated circuit 6, is heat sink assembly 7. Heat sink assembly 7 is configured with a fan and related air passages (not shown) to allow convective cooling by air flow 8 when driven by a fan 9.

The embodiment in FIG. 1 also includes control switch 11. Switch 11 provides power to fan 9 and to other computer system enclosure fans where appropriate. Switch 11 selectively enables or disables fan 9 in response to the RUN/SLEEP power management state signal provided on line 12. The state signal on line 12 is often also identified as the "halt" or "power-down" signal generated by microprocessors following inactivity for a specified period of time. As shown in FIG. 1, the RUN/SLEEP signal is also provided to the integrated circuit through one of the connections between printed circuit board 1 and ceramic package base 4. In those cases where integrated circuit 6 is a microprocessor, the RUN/SLEEP signal will most likely originate in the integrated circuit itself. On the other hand, if integrated circuit 6 is part of the board logic supporting the microprocessor, the state signal on line 12 will most likely originate in the microprocessor and be provided to integrated circuit 6 through the connection shown.

The invention recognizes that the operational state of fan 9 in conjunction with heat sink 7 constitutes a thermal impedance which can change materially depending on whether fan 9 is enabled or disabled. The thermal impedance between integrated circuit 6 and the ambient air is composed of the various paths for heat transfer.

Figure 2:
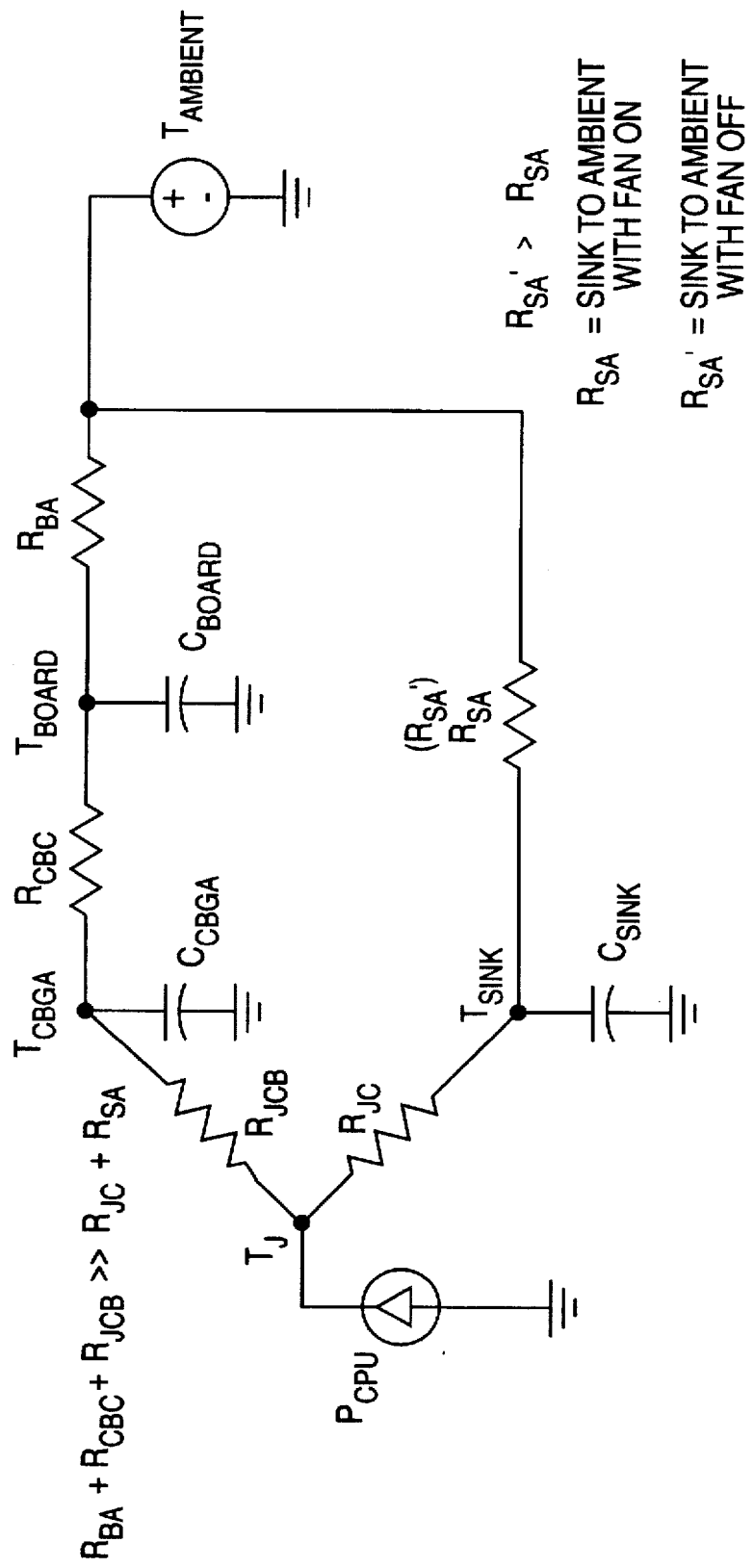
FIG. 2 is a schematic diagram depicting the thermal equivalent circuit of the structure in FIG. 1.

FIG. 2 schematically illustrates a thermal equivalent circuit for the mechanical elements in FIG. 1.

$C_{BOARD}$—Thermal storage capacity of the printed circuit board.

$C_{CBGA}$—Heat storage capacity of the ceramic package base and related ball grid assembly.

$C_{SINK}$—Thermal capacity of the heat sink.

$P_{CPU}$—Power generated by an integrated circuit processor.

$R_{BA}$—Thermal impedance between the printed circuit board and the ambient air.

$R_{CBC}$—Thermal impedance between the ball grid assembly and the printed circuit board.

$R_{JC}$—Thermal impedance between the integrated circuit junction and the heat sink attached to the integrated circuit.

$R_{JCB}$—Thermal impedance between the integrated circuit junction and the ceramic package base.

$R_{SA}$—Thermal impedance between the heat sink and the ambient air with the fan running.

$R_{SA}'$—Thermal impedance between the heat sink and the ambient air with the fan off.

$T_{AMBIENT}$—Temperature of the ambient air.

$T_{BOARD}$—Temperature of the printed circuit board.

$T_{CBGA}$—Temperature of the ceramic package base and related ball grid assembly.

$T_J$—Junction temperature of the integrated circuit.

$T_{SINK}$—Temperature of the heat sink.

Since $R_{JC}$, $R_{JCB}$, and $R_{SA}$ ($R_{SA}'$) are materially smaller in value than the other thermal impedances, they dictate to a large extent the temperature of ceramic package base 4 in relation to the temperature of printed circuit board 1, and the correspondingly thermal stress applied to the ball grid array solder connections. As noted earlier, cycling of the power generated by microprocessor integrated circuit chip 6, corresponding to $P_{CPU}$, introduces corresponding thermal stress cycles and accentuated rates of thermal stress induced fatigue and failure of the ball grid array solder connections.

According to the invention, thermal stresses and corresponding failure rates are reduced through the selective control of fan 9 in direct correspondence with the RUN/SLEEP signal on line 12. The benefits are attributable to two factors. First, and foremost, when fan 9 is disabled, and thermal impedance $R_{SA}$ is increased to $R_{SA}'$, the rates at which temperatures $T_{SINK}$ and $T_{CBGA}$ change decrease. Accordingly, the temperature differences between printed circuit board 1 and ceramic package base 4, and the related thermal stresses, are materially decreased. As a second factor, the absolute temperature excursions of $T_{CBGA}$ are not as extreme, since thermal impedance $R'_{SA}$ is sufficiently high to allow the limited power dissipated in the integrated circuit during the sleep mode to establish a temperature somewhat above the ambient air temperature $T_{AMBIENT}$. In contrast, with the fan running and $R_{SA}$ at a very low value the temperature of the ceramic package base $T_{CBGA}$ is drawn down nearly to the level of the ambient when the printed circuit is dissipating power at its sleep state level.

FIG. 3 illustrates by representative plots the effects of using the present invention in contrast to the conventional practice of continuously operating fan 9. The first plot shows the power $P_{CPU}$ generated by the integrated circuit, where level $P_{RUN}$ represents its full output in normal operating mode while level $P_{SLEEP}$ represents the lower power output corresponding to the sleep or power-down modes. The RUN/SLEEP signal, corresponding to the power management state, is shown directly below in correspondence to the integrated circuit power generated. Next within the plots, the operation of the fan according to the present invention is referenced to the integrated circuit power generated and the state of the power management signal. Lastly, the temperature $T_{CBGA}$ of ceramic package base 4 and its related ball grid array are plotted in timed correspondence to the integrated circuit power shown above. Note that in all cases temperature plot 13, shown by solid lines, exhibits both rate of change and extremes of excursion that are less when the invention apparatus and methods are used in the course of an operational sequence where the integrated circuit chip power modulates between its run level and its sleep level. In contrast, plot 14, designated by dashed lines, exhibits the greater rates of change and temperature extremes characterizing conventional practices.

Given the reduction in temperature rates of change and temperature extremes at $T_{CBGA}$, the decrease in the temperature differential between ceramic package base 4 and printed circuit board 1 reduces the levels of thermal stress imposed on the ball grid array solder joint. An analogous decrease in the number of thermal stress induced fatigue failures and increase of reliability follow.

A variation of the present invention contemplates a corresponding disablement of other fans within the computer. As a consequence, the value of thermal impedance $R_{BA}$ is increased in synchronism with $R_{SA}$ and the power dissipation of the integrated circuit chip. Increasing the value of thermal impedance $R_{BA}$ further reduces, though significantly less pronounced, the relative temperature difference between $T_{CBGA}$ and $T_{BOARD}$, and accordingly further reduces the thermal stress induced fatigue failure rate.

Though the invention has been described in the context of a solder ball connection between juxtaposed surfaces of materially different coefficients of thermal expansion, the features of the invention are equally applicable to connections created through solder posts or fully reflowed solder connections.

Though the invention has been described and illustrated by way of specific embodiments, it is intended that the systems and methods in the appended claims encompass changes within the scope of the invention is broadly disclosed.

We claim:

1. In a computer system utilizing convection cooling to constrain integrated circuit package temperatures, apparatus limiting temperature excursions, comprising:

a selectively operable first fan providing convective cooling to a selected packaged integrated circuit;

power management resources in the packaged integrated circuit indicating by state signal high and low operating power states of the packaged integrated circuit; and means for enabling the operation of the first fan responsive to an indication of a high power state and disabling the operation of the first fan responsive to an indication of a low power state, without regard to the packaged integrated circuit temperature.

2. The apparatus recited in claim 1, wherein the integrated circuit package comprises a ball grid array.

3. The apparatus recited in claim 2, wherein the ball grid array integrated circuit package is ceramic and has a heat sink attached thereto.

4. The apparatus recited in claim 3, further comprising a control responsive to the power management state signal for selectively enabling a second fan operable to move air within an enclosure including both the package integrated circuit and a printed circuit board to which the packaged integrated circuit is attached.

5. A method of limiting temperature excursions in a computer system utilizing convection cooling to constrain integrated circuit package temperatures, comprising the steps of:

positioning a convective coolant first fan proximate a selected packaged integrated circuit;

detecting high and low operating power state signals from a power management resource in the packaged integrated circuit;

enabling the first fan responsive to the sensing of a high operating power state; and disabling the first fan responsive to the sensing of a low operating power state.

6. The method recited in claim 5, wherein the integrated circuit package comprises a ball grid array.

7. The method recited in claim 6, wherein the ball grid array integrated circuit package is ceramic and has a heat sink attached thereto.

8. The method recited in claim 7, wherein the steps of enabling and disabling are applicable to a second fan which moves air within an enclosure including both the packaged integrated circuit and a printed circuit board to which the packaged integrated circuit is attached.

* * * * *